US012759029B2

(12) United States Patent

Jeong et al.

(10) Patent No.: US 12,759,029 B2
(45) Date of Patent: Oct. 13, 2026

(54) CLEANING APPARATUS

(71) Applicant: Samsung Electronics Co., Ltd., Suwon-si (KR)

(72) Inventors: Seonguk Jeong, Suwon-si (KR); Youngshin Choi, Suwon-si (KR); Sungchul Kim, Suwon-si (KR); Youngsoo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 104 days.

(21) Appl. No.: 18/743,719

(22) Filed: Jun. 14, 2024

(65) Prior Publication Data

US 2025/0187051 A1 Jun. 12, 2025

(30) Foreign Application Priority Data

Dec. 6, 2023 (KR) ........................ 10-2023-0175066

(51) Int. Cl.

| | |
|---|---|
| ***B08B 15/02*** | (2006.01) |
| ***B08B 5/02*** | (2006.01) |
| ***B08B 5/04*** | (2006.01) |
| ***B08B 7/02*** | (2006.01) |
| *H10P 72/00* | (2026.01) |

(52) U.S. Cl.

CPC ................ *B08B 15/02* (2013.01); *B08B 5/02* (2013.01); *B08B 5/04* (2013.01); *B08B 7/02* (2013.01); *B08B 2215/003* (2013.01); *H10P 72/0414* (2026.01)

(58) Field of Classification Search

CPC .. B08B 15/02; B08B 5/02; B08B 5/04; B08B 7/02; B08B 2215/003; H01L 21/67051

USPC .......................................................... 134/172

See application file for complete search history.

(56) References Cited

U.S. PATENT DOCUMENTS

| | | | | |
|---|---|---|---|---|
| 6,565,669 | B1 | 5/2003 | Bohon, III | |
| 8,141,570 | B2 | 3/2012 | Hasebe et al. | |
| 2007/0199580 | A1 * | 8/2007 | Hasebe .................. | B08B 15/04 15/310 |

FOREIGN PATENT DOCUMENTS

| | | | | |
|---|---|---|---|---|
| CN | 110416127 | A | 11/2019 | |
| CN | 110718488 | A * | 1/2020 | ......... H01L 21/6838 |
| KR | 10-2006-0032914 | A | 4/2006 | |
| KR | 20-2011-0006008 | A | 6/2011 | |
| KR | 10-1207384 | B1 | 12/2012 | |
| KR | 10-1625703 | B1 | 5/2016 | |
| KR | 10-2257279 | B1 | 5/2021 | |

(Continued)

OTHER PUBLICATIONS

CN110718488A—machine translation (Year: 2020).*

(Continued)

*Primary Examiner* — Tinsae B Ayalew

(74) *Attorney, Agent, or Firm* — Fish & Richardson P.C.

(57) ABSTRACT

A cleaning apparatus may include a cleaning chamber, a vacuum generator and an air injection module. The cleaning chamber may be configured to receive a tray, the tray may be configured to receive a plurality of objects. The vacuum generator may be configured to apply vacuum into the cleaning chamber and fix a lower surface of the tray. The air injection module may be configured to inject air to an upper surface of the tray to remove a contaminant from the objects. Thus, the cleaning apparatus may have improved cleaning efficiency without a damage of the object.

18 Claims, 9 Drawing Sheets

(56) References Cited

FOREIGN PATENT DOCUMENTS

| | | | |
|---|---|---|---|
| KR | 10-2022-0000689 | A | 1/2022 |
| KR | 10-2446950 | B1 | 9/2022 |
| KR | 10-2488045 | B1 | 1/2023 |

OTHER PUBLICATIONS

KR102488045B1—machine translation (Year: 2023).*
KR20220000689A—machine translation (Year: 2022).*
CN110416127A—machine translation (Year: 2019).*

* cited by examiner

CLEANING APPARATUS

CROSS-RELATED APPLICATION

This application claims priority under 35 USC § 119 to Korean Patent Application No. 10-2023-0175066, filed on Dec. 6, 2023 in the Korean Intellectual Property Office (KIPO), the contents of which are herein incorporated by reference in their entirety.

BACKGROUND

1. Field

Various example embodiments relate to a cleaning apparatus. More particularly, example embodiments relate to a cleaning apparatus configured to clean a semiconductor package.

2. Description of the Related Art

While a semiconductor package may be fabricated and/or transferred, the semiconductor package may be contaminated by a contaminant. The contaminant may cause a faulty appearance of the semiconductor package. Further, the contaminant may decrease a performance of the semiconductor package. Furthermore, the contaminant may contaminate a following equipment. Thus, it may be required (or beneficial) to remove the contaminant from the semiconductor package using a cleaning apparatus.

According to related arts, the cleaning apparatus may include a brush. The brush may directly make contact (or may make contact) with the semiconductor package to remove the contaminant. However, the direct contact (or the contact) between the brush and the semiconductor package may damage the semiconductor package. Further, the direct contact (or the contact) between the brush and the semiconductor package may generate an electrostatic error.

SUMMARY

Various example embodiments provide a cleaning apparatus that may be capable of effectively removing (or may be capable of removing) a contaminant without damaging a semiconductor package.

Some example embodiments of inventive concepts provide a cleaning apparatus including a cleaning chamber configured to receive a tray, the tray configured to receive a plurality of objects, a vacuum generator configured to apply vacuum into the chamber and fix a lower surface of the tray, and an air injection module configured to inject air to an upper surface of the tray.

Some example embodiments of inventive concepts provide a cleaning apparatus including a cleaning chamber configured to receive a tray, the tray configured to receive a plurality of semiconductor packages, a vacuum generator configured to apply vacuum into the cleaning chamber and fix a lower surface of the tray, an air injection module configured to inject air to an upper surface of the tray, a mesh cover configured to fix the upper surface of the tray, and a vibrator applier configured to apply a vibration to the tray.

According to some example embodiments of inventive concepts, the semiconductor package may be cleaned in the cleaning chamber to prevent (or reduce the chances of) the semiconductor package from being secondarily contaminated by a contaminant. Further, the air injection module may inject the air to the semiconductor package to remove the contaminant in a non-contact manner to prevent a damage of the semiconductor package (or to reduce a possibility of the semiconductor package being damaged). Furthermore, the vibration applier may apply the vibration to the semiconductor package to improve a removal efficiency of the contaminant.

BRIEF DESCRIPTION OF THE DRAWINGS

Various example embodiments will be more clearly understood from the following detailed description taken in conjunction with the accompanying drawings.

FIG. 1 is a perspective view illustrating a cleaning apparatus in accordance with some example embodiments;

FIG. 2 is an exploded perspective view illustrating the cleaning apparatus in FIG. 1;

FIG. 3 is an exploded perspective view illustrating a mesh cover of the cleaning apparatus in FIG. 2;

FIG. 4 is a perspective view illustrating a vibration applier of the cleaning apparatus in FIG. 2;

FIG. 5 is a perspective view illustrating an air injection module of the cleaning apparatus in FIG. 2;

FIG. 6 is a cross-sectional view illustrating a nozzle of the air injection module in FIG. 5;

FIGS. 7 to 9 are plan views illustrating a nozzle head of the air injection module in FIG. 5;

FIGS. 10 and 11 are perspective views illustrating a nozzle head of the air injection module in FIG. 5; and FIG. 12 is a graph showing a flow rate of air by time injected from the air injection module in FIG. 5.

DETAILED DESCRIPTION OF THE EMBODIMENTS

Hereinafter, various example embodiments will be explained in detail with reference to the accompanying drawings.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," or the like with regard to other elements and/or properties thereof (e.g., structures, surfaces, directions, or the like) may be "perpendicular," "parallel," or the like or may be "substantially perpendicular," "substantially parallel," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

Figure 1:
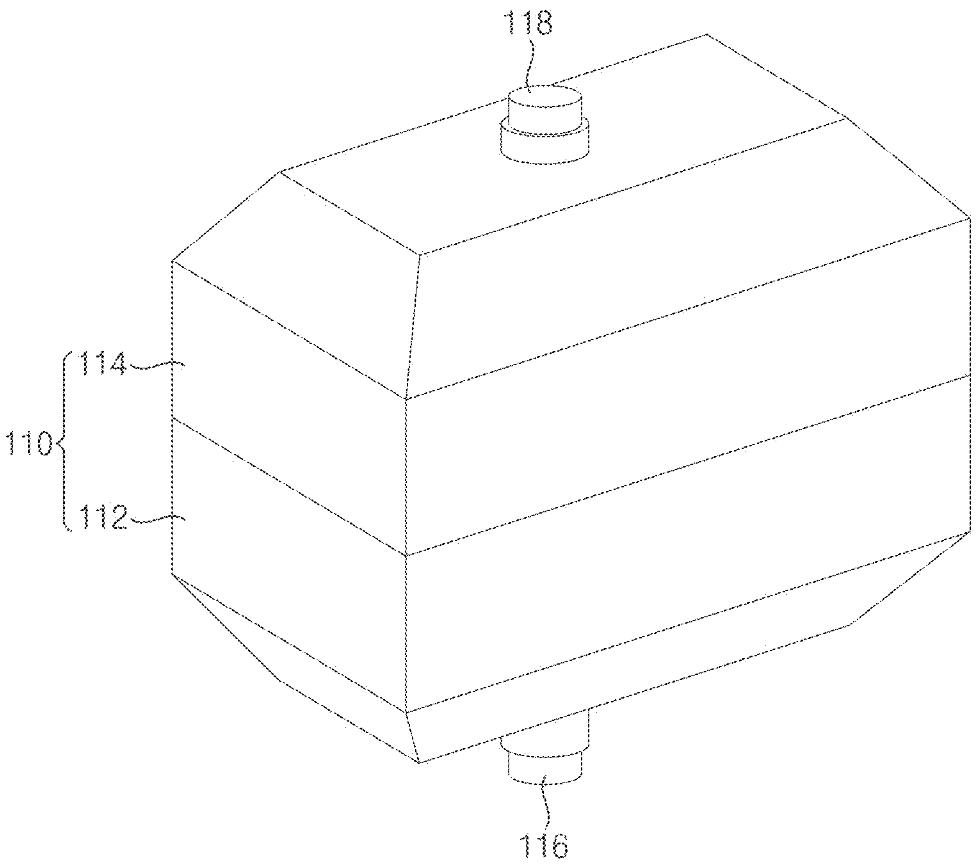
FIGS. 1 to 12 represent non-limiting, example embodiments as described herein.
Figure 2:
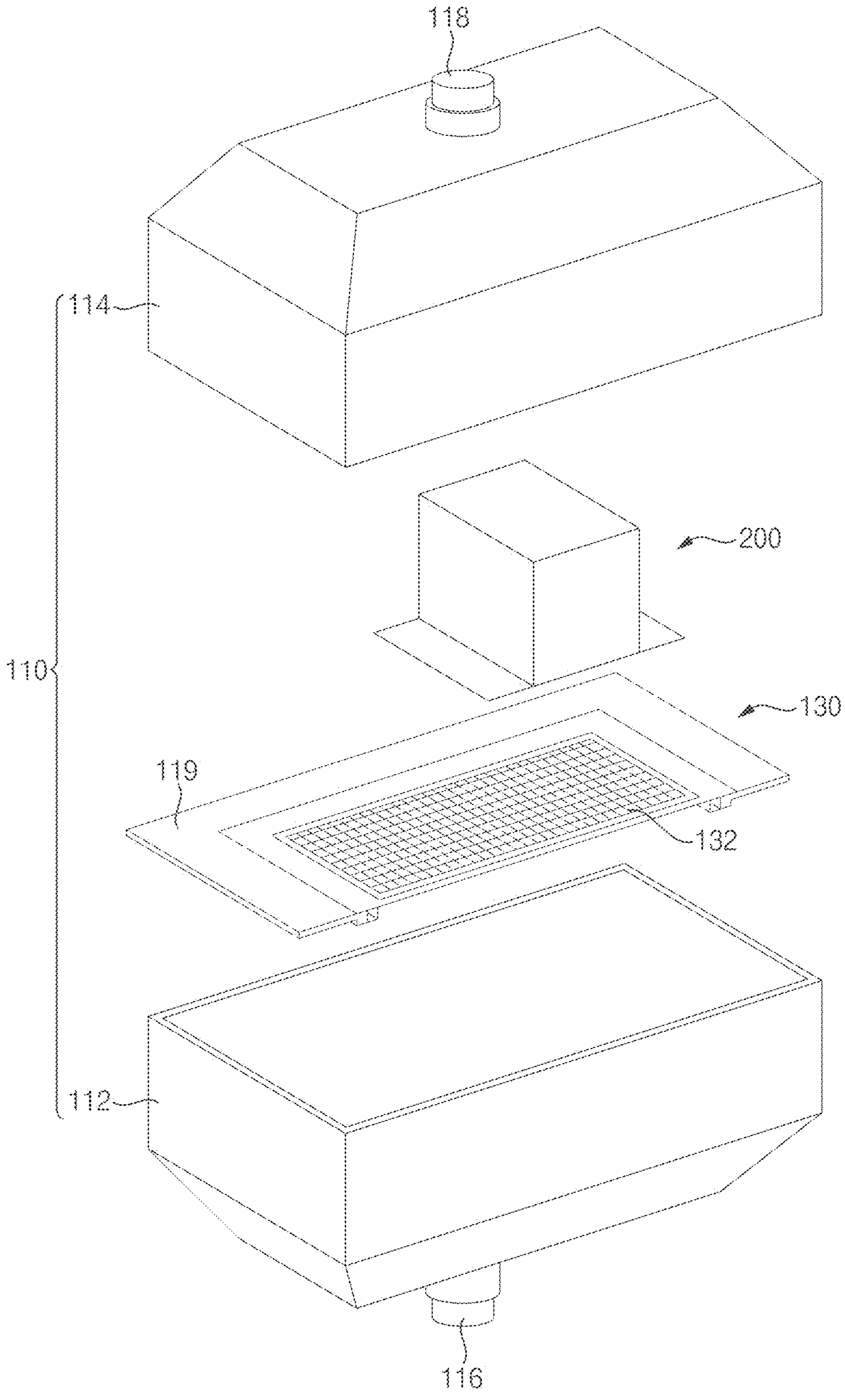
Figure 3:
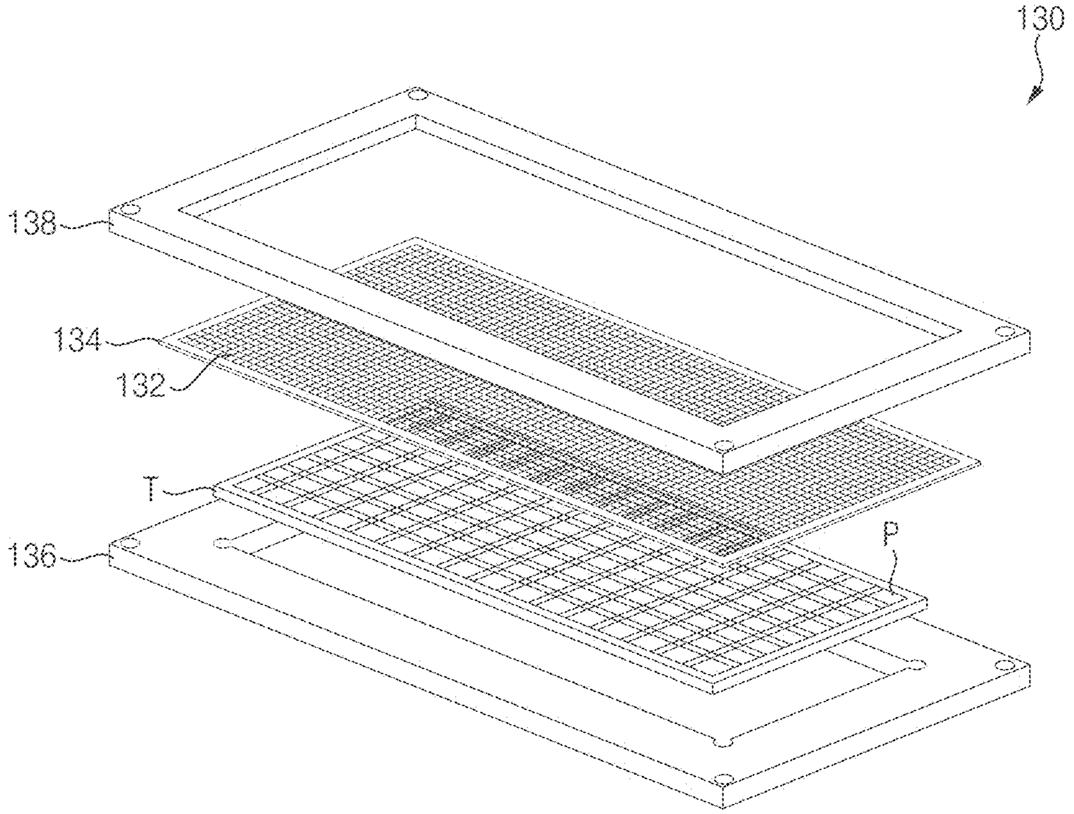
Figure 4:
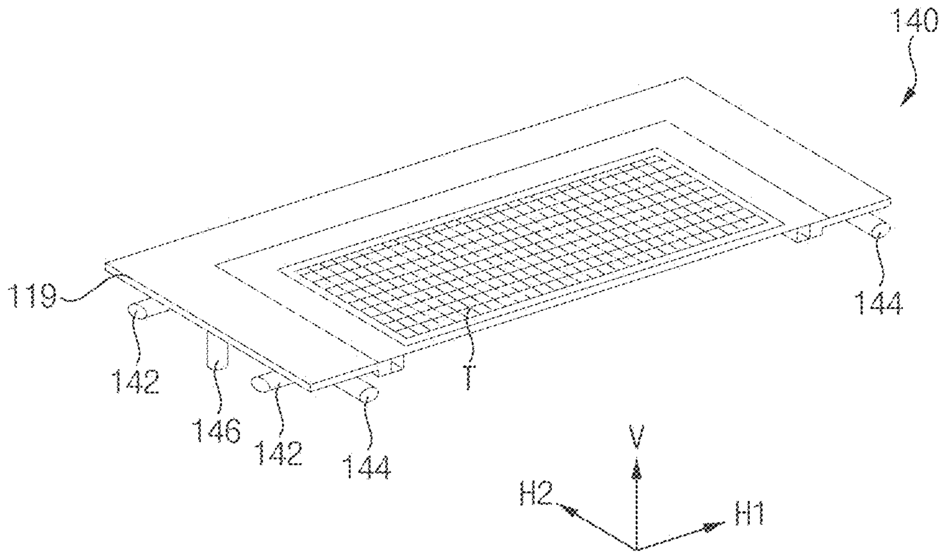

FIG. 1 is a perspective view illustrating a cleaning apparatus in accordance with some example embodiments, FIG. 2 is an exploded perspective view illustrating the cleaning apparatus in FIG. 1, FIG. 3 is an exploded perspective view illustrating a mesh cover of the cleaning apparatus in FIG. 2 and FIG. 4 is a perspective view illustrating a vibration applier of the cleaning apparatus in FIG. 2.

A cleaning apparatus of example embodiments may clean an object using air in a non-contact manner (without contacting the object being cleaned). For example, the cleaning apparatus may not physically make contact with the object. The cleaning apparatus may inject the air having a high pressure to the object to remove a contaminant from the object. The object may include a semiconductor package P, but example embodiments are not limited thereto.

Referring to FIGS. 1 to 4, the cleaning apparatus of some example embodiments may include a cleaning chamber 110, a vacuum generator 120, an air injection module 200, a mesh cover 130 and a vibration applier 140.

The cleaning chamber 110 may receive a tray T configured to receive a plurality of the semiconductor packages P. For example, the tray T may be placed on a supporting plate 119. The supporting plate 119 with the tray T may be received in the cleaning chamber 110. Thus, the semiconductor packages P may be cleaned in the cleaning chamber 110 to prevent the semiconductor packages P from being secondarily contaminated by the contaminant scattered in a cleaning process (or the semiconductor packages P may be cleaned in the cleaning chamber 110 to reduce the possibility of the semiconductor packages P from being secondarily contaminated by the contaminant scattered in a cleaning process).

In some example embodiments, the cleaning chamber 110 may include a lower chamber 112 and an upper chamber 114. The lower chamber 112 and the upper chamber 114 may be selectively combined with each other. For example, an upper end of the lower chamber 112 may be selectively docked with a lower end of the upper chamber 114. The tray T may be arranged between the lower chamber 112 and the upper chamber 114. Thus, the lower chamber 112 may have an opened upper surface. Further, the upper chamber 114 may have an opened lower surface.

The lower chamber 112 may be connected to the vacuum generator 120. For example, a lower exhaust port 116 may be formed (or may be provided) on a central portion of a lower surface of the lower chamber 112, but example embodiments are not limited thereto. The vacuum generator 120 may be connected to the lower exhaust port 116. Thus, vacuum generated from the vacuum generator 120 may be introduced into the lower chamber 112 through the lower exhaust port 116 so that the lower chamber 112 may be a vacuum chamber. The vacuum in the lower chamber 112 may fix a lower surface of the tray T. Because the tray T may be placed on the supporting plate 119, the vacuum may fix a lower surface of the supporting plate 119. The vacuum generator 120 may include a vacuum pump, but example embodiments are not limited thereto.

The upper chamber 114 may be combined with the lower chamber 112. The mesh cover 130 and the air injection module 200 may be received in the upper chamber 114. The upper chamber 114 may include an upper exhaust port 118. The upper exhaust port 118 may be formed (or may be provided or arranged) on a central portion of an upper surface of the upper chamber 114, but example embodiments are not limited thereto. Air injected from the air injection module 200 and the contaminant removed by the air may be exhausted through the upper exhaust port 118.

The mesh cover 130 may be arranged on an upper surface of the tray T to fix the upper surface of the tray T. The upper surface of the tray T may be fixed by the vacuum and the lower surface of the tray T may be fixed by the mesh cover 130. Thus, the semiconductor package P may not be released from the tray T by the air injected from the air injection module 200.

In some example embodiments, the mesh cover 130 may include a mesh 132, a mesh frame 134, a lower frame 136 and an upper frame 138.

The mesh 132 may be configured to cover the upper surface of the tray T. The air injected from the air injection module 200 may be applied to the semiconductor packages P in the tray T through the mesh 132. The mesh frame 134 may be configured to support an edge portion of the mesh 132. Thus, the mesh 132 may have a rectangular shape, as well as the mesh frame 134 may have a rectangular frame shape.

The lower frame 136 may be combined with a lower surface of the mesh frame 134 to support the lower surface of the mesh frame 134. The upper frame 138 may be combined with an upper surface of the mesh frame 134 to support the upper surface of the mesh frame 134. Thus, the lower frame 136 and the upper frame 138 may have a rectangular frame shape.

The vibration applier 140 may apply a vibration to the tray T. In some example embodiments, when the vibration may be applied to the tray T, the vibration may also be applied to the semiconductor packages P. The vibration may function as to weaken a bonding strength between the contaminant and the semiconductor package P. Thus, the contaminant may be floated from the semiconductor package P by the vibration so that the contaminant may be readily removed (or may be removed) from the semiconductor package P by the air.

In some example embodiments, the vibration applier 140 may include a first eccentrical motor 142, a second eccentrical motor 144 and a third eccentrical motor 146.

The first eccentrical motor 142 may be arranged on the lower surface of the supporting plate 119 in a first horizontal direction H1. The first eccentrical motor 142 may apply the vibration to the supporting plate 119 in the first horizontal direction H1. The vibration in the first horizontal direction H1 may be applied to the semiconductor packages P through the tray T so that the semiconductor packages P may be vibrated along the first horizontal direction H1. In some example embodiments, the first eccentrical motor 142 may include a pair of motors, but example embodiments are not limited thereto.

The second eccentrical motor 144 may be arranged on the lower surface of the supporting plate 119 in a second horizontal direction H2 substantially perpendicular to the first horizontal direction H1. The second eccentrical motor 144 may apply the vibration to the supporting plate 119 in the second horizontal direction H2. The vibration in the second horizontal direction H2 may be applied to the semiconductor packages P through the tray T so that the semiconductor packages P may be vibrated along the second horizontal direction H2. In some example embodiments, the second eccentrical motor 144 may include a pair of motors, but example embodiments are not limited thereto.

The third eccentrical motor 146 may be arranged on the lower surface of the supporting plate 119 in a vertical direction V. The third eccentrical motor 146 may apply the vibration to the supporting plate 119 in the vertical direction V. The vibration in the vertical direction V may be applied to the semiconductor packages P through the tray T so that the semiconductor packages P may be vibrated along the vertical direction V. In some example embodiments, the third eccentrical motor 146 may include a pair of motors, but example embodiments are not limited thereto.

Figure 5:
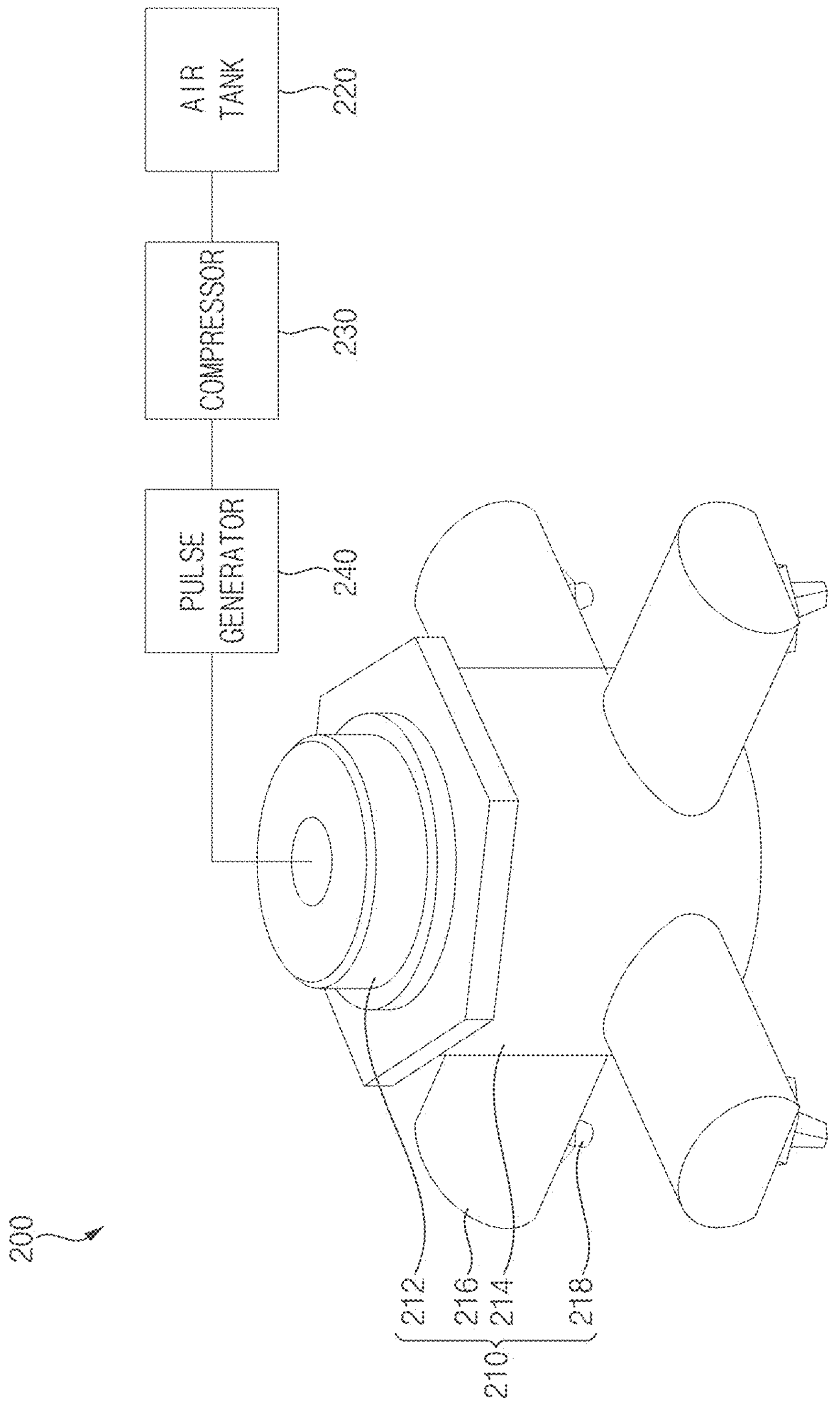
Figure 6:
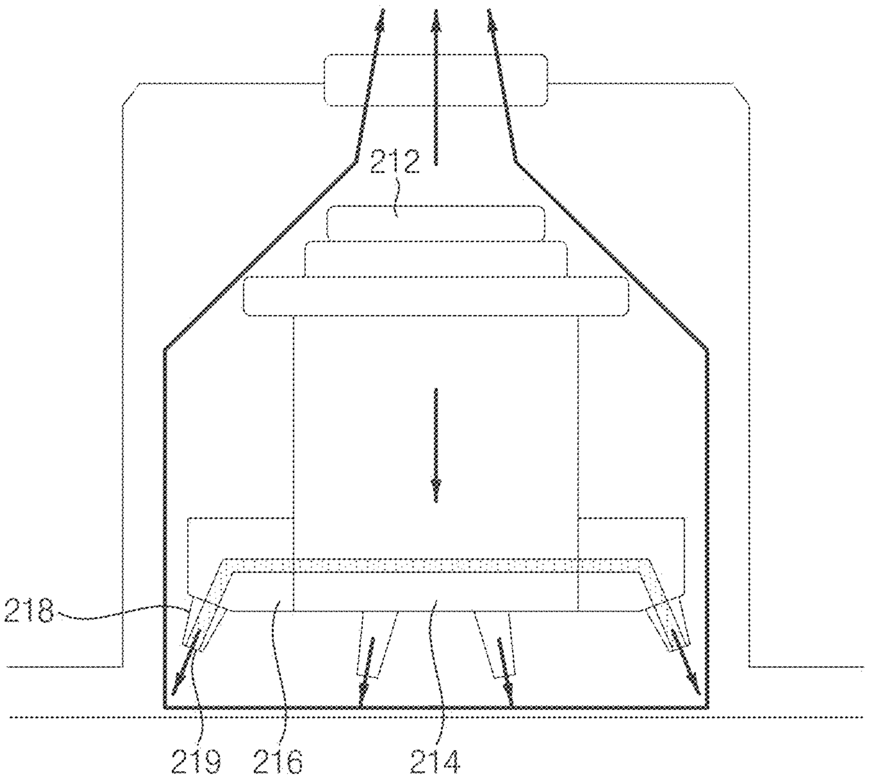
Figure 7:
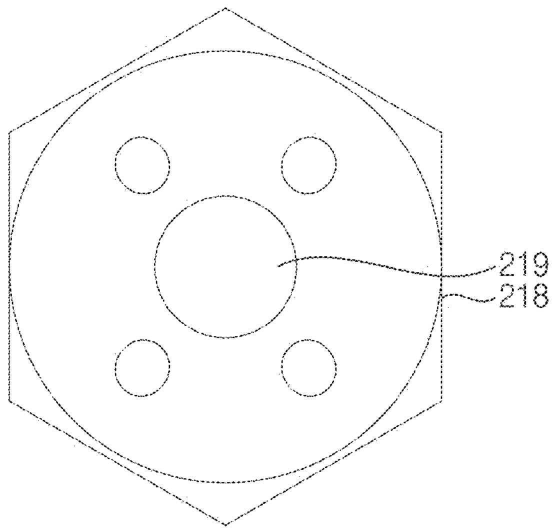
Figure 8:
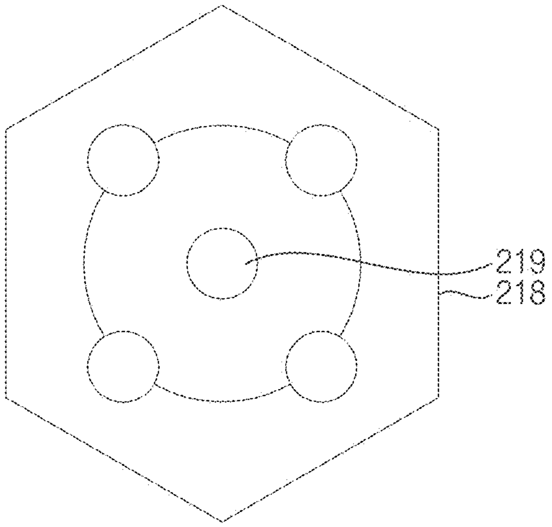
Figure 9:
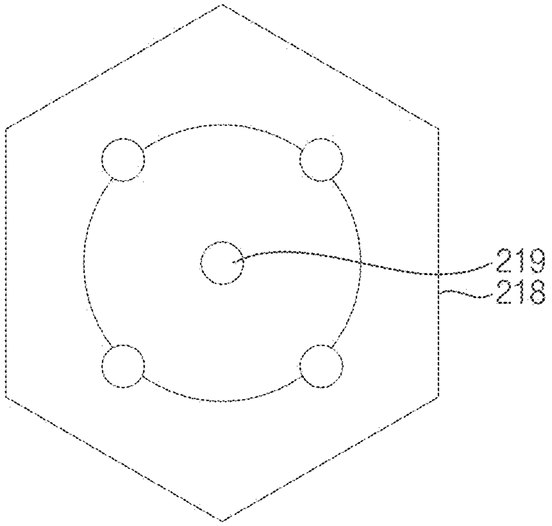
Figure 10:
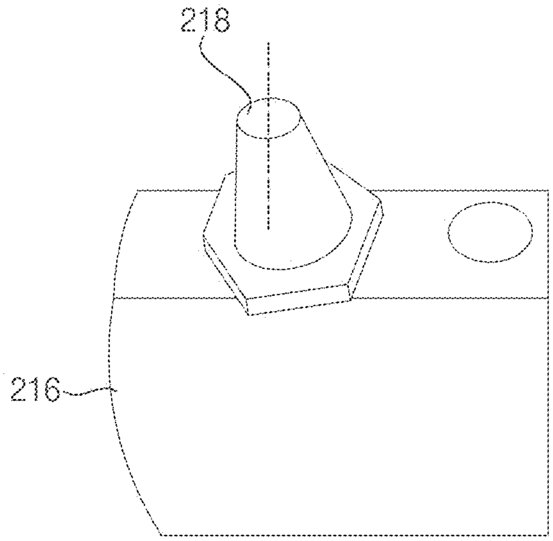
Figure 11:
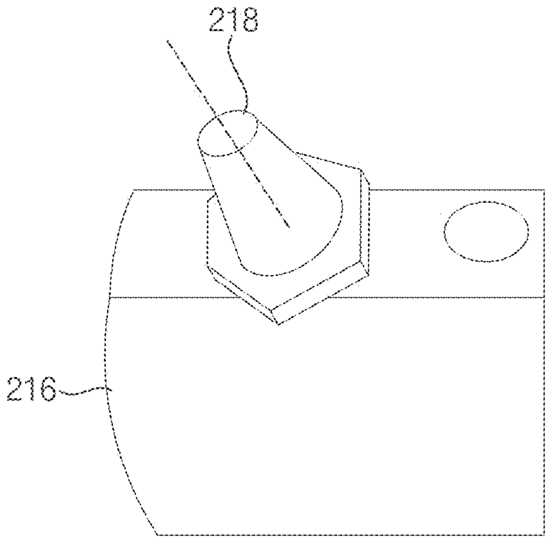
Figure 12:
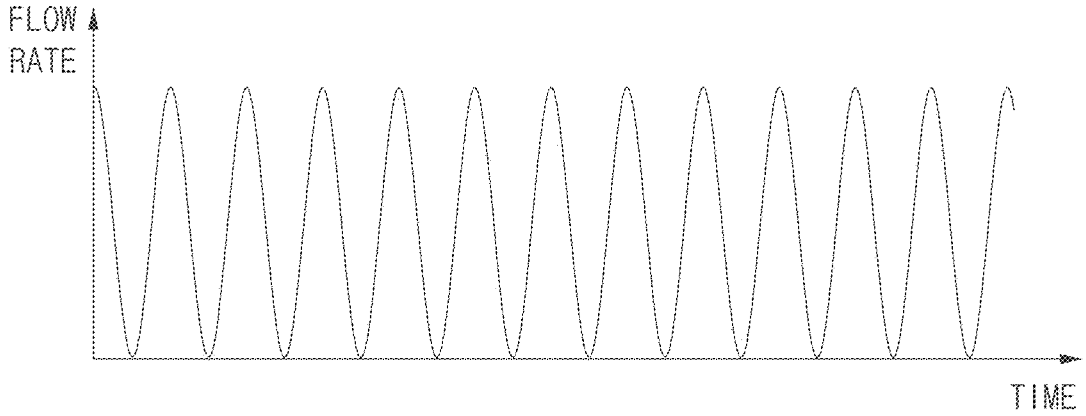

FIG. 5 is a perspective view illustrating an air injection module of the cleaning apparatus in FIG. 2. FIG. 6 is a cross-sectional view illustrating a nozzle of the air injection module in FIG. 5. FIGS. 7 to 9 are plan views illustrating a nozzle head of the air injection module in FIG. 5. FIGS. 10 and 11 are perspective views illustrating a nozzle head of the air injection module in FIG. 5. FIG. 12 is a graph showing a flow rate of air by time injected from the air injection module in FIG. 5.

Referring to FIGS. 5 to 11, the air injection module 200 may be arranged over the tray T. For example, the air injection module 200 may be arranged over a central portion of the upper surface of the tray T, but example embodiments are not limited thereto. The air injection module 200 may inject the air to the semiconductor packages P in the tray T to remove the contaminant from the semiconductor packages P. For example, the air injection module 200 may inject a pulse type air to the semiconductor packages P.

In some example embodiments, the air injection module 200 may include a nozzle 210, an air tank 220, an air line 250, a compressor 230 and a pulse generator 240. The air tank 220 may store the air. The air line 250 may be connected between the nozzle 210 and the air tank 220. The compressor 230 and the pulse generator 240 may be arranged on the air line 250. The compressor 230 may provide the air with a high pressure to form the air having the high pressure.

The nozzle 210 may inject the air provided from the air tank 220 to the semiconductor packages P For example, the nozzle 210 may inject the pulsed air formed by the pulse generator 240 to the semiconductor packages P.

In some example embodiments, the nozzle 210 may include a spindle 212, a nozzle block 214, a plurality of nozzle bars 216 and a plurality of nozzle heads 218.

The spindle 212 may be arranged over the tray T. The air line 250 may be connected to the spindle 212. Thus, the air may be introduced into the spindle 212.

The nozzle block 214 may be rotatably connected (or may be connected) to a lower surface of the spindle 212 with respect to the vertical direction V. The nozzle bars 216 may extend from the nozzle block 214 in the horizontal direction. In some example embodiments, the nozzle bars 216 may include four bars spaced apart from each other by a uniform gap, but example embodiments are not limited thereto. The air in the spindle 212 may be supplied into the nozzle block 214 and the nozzle bars 216.

Each of the nozzle heads 218 may be formed at each of the nozzle bars 216. For example, the nozzle head 218 may extend from a lower surface of the nozzle bar 216 toward the tray T. The nozzle head 218 may include a plurality of nozzle holes 219. The air may be injected to the semiconductor packages P through the nozzle holes 219. Numbers of the nozzle holes 219 formed at one nozzle head 218 may not be restricted.

In some example embodiments, an exhaust hole 217 in FIG. 10 may be formed through the nozzle head 218. The air in the nozzle head 218 may be exhausted through the exhaust hole 217. The nozzle head 218 may be rotated with respect to the spindle 212 by a force of the air, e.g., a pneumatic pressure exhausted through the exhaust hole 217. However, the nozzle head 218 may be rotated by other manners as well as the force of the air through the exhaust hole 217.

Additionally, the nozzle bar 216 may be movably connected (or may be connected) to the nozzle block 214 in the vertical direction V. In some example embodiments, a distance between the nozzle head 218 and the semiconductor package P, for example, the nozzle hole 219 and the semiconductor package P may be controlled so that a distance for optimally removing the contaminant may be provided between the nozzle hole 219 and the semiconductor package P (or a distance for removing the contaminant may be provided between the nozzle hole 210 and the semiconductor package P).

For example, as shown in FIGS. 7 to 9, the nozzle holes 219 may have different diameters. The nozzle hole 219 in FIG. 7 may have the longest diameter. The nozzle hole 219 in FIG. 9 may have the shortest diameter. For example, the diameter of the nozzle hole 219 in FIG. 8 may be shorter than the diameter of the nozzle hole 219 in FIG. 7 and longer than the diameter of the nozzle hole 219 in FIG. 9.

Further, as shown in FIGS. 10 and 11, the nozzle holes 219 may have different injection angles. The nozzle hole 219 in FIG. 10 may extend in the vertical direction V. The nozzle hole 219 in FIG. 11 may extend in a direction inclined to the vertical direction V. For example, the nozzle heads 218 having the different injection angles may be detachably connected to the nozzle bar 216 using a magnet.

Referring again to FIG. 5, the pulse generator 240 may apply the pulse to the air to form the pulsed air. As shown in FIG. 12, the pulsed air may have flow rates changed in accordance with times. Thus, the pulsed air may effectively remove the contaminants having various shapes from the semiconductor package P (or the pulsed air may remove the contaminants having various shapes from the semiconductor package P).

According to some example embodiments, the semiconductor package may be cleaned in the cleaning chamber to prevent the semiconductor package from being secondarily contaminated by a contaminant (or the semiconductor package may be cleaned in the cleaning chamber to reduce a possibility of a contaminant contaminating the semiconductor package). Further, the air injection module may inject the air to the semiconductor package to remove the contaminant in a non-contact manner to prevent (or reduce) a damage of the semiconductor package. Furthermore, the vibration applier may apply the vibration to the semiconductor package to improve a removal efficiency of the contaminant (or to improve a removal of the contaminant).

The foregoing is illustrative of some example embodiments and is not to be construed as limiting thereof. Although a few example embodiments have been described, those skilled in the art will readily appreciate that many modifications are possible in the example embodiments without droplet departing from the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A cleaning apparatus comprising:

a cleaning chamber configured to receive a tray, the tray configured to receive a plurality of objects;

a vacuum generator configured to apply vacuum into the cleaning chamber and fix a lower surface of the tray; and an air injection module comprising a nozzle block with a plurality of nozzle holes, wherein the nozzle block is configured to rotatably inject air through the plurality of nozzle holes to an upper surface of the tray, wherein the air injection module comprises a nozzle arranged over the tray and configured to inject air to the upper surface of the tray, an air line configured to supply the air to the nozzle, a compressor arranged on the air line and configured to provide the air with a pressure, and a pulse generator arranged on the air line and configured to provide the air with a pulse, and wherein the nozzle comprises a spindle, the nozzle block rotatably connected to the spindle with respect to a vertical direction;

a plurality of nozzle bars extending from the nozzle block in a horizontal direction; and a nozzle head extending from each of the plurality of the nozzle bars toward the tray and including the plurality of nozzle holes configured to inject the air.

2. The cleaning apparatus of claim 1, wherein the cleaning chamber comprises:

a lower chamber connected to the vacuum generator and configured to receive the vacuum and to make contact with the lower surface of the tray; and an upper chamber combined with the lower chamber and configured to receive the air injection module.

3. The cleaning apparatus of claim 2, wherein the lower chamber comprises a lower exhaust port arranged at a lower surface of the lower chamber and connected to the vacuum generator.

4. The cleaning apparatus of claim 2, wherein the upper chamber comprises an upper exhaust port arranged at an upper surface of the upper chamber.

5. The cleaning apparatus of claim 1, wherein the plurality of the nozzle holes have different diameters.

6. The cleaning apparatus of claim 1, wherein the plurality of the nozzle holes have different injection angles.

7. The cleaning apparatus of claim 1, further comprising:

a mesh cover configured to fix the upper surface of the tray.

8. The cleaning apparatus of claim 7, wherein the mesh cover comprises:

a mesh configured to cover the upper surface of the tray; and a mesh frame configured to support an edge portion of the mesh.

9. The cleaning apparatus of claim 8, wherein the mesh cover further comprises:

a lower frame configured to support a lower surface of the mesh frame; and an upper frame configured to support an upper surface of the mesh frame.

10. The cleaning apparatus of claim 1, further comprising:

a vibration applier configured to apply a vibration to the tray.

11. The cleaning apparatus of claim 10, wherein the vibration applier comprises:

a first eccentrical motor configured to apply the vibration to the tray in a first horizontal direction;

a second eccentrical motor configured to apply the vibration to the tray in a second horizontal direction perpendicular to the first horizontal direction; and a third eccentrical motor configured to apply the vibration to the tray in the vertical direction.

12. The cleaning apparatus of claim 1, wherein the plurality of the objects comprise semiconductor packages.

13. A cleaning apparatus comprising:

a cleaning chamber configured to receive a tray, the tray configured to receive a plurality of semiconductor packages;

a vacuum generator configured to apply vacuum into the cleaning chamber and fix a lower surface of the tray;

an air injection module comprising a nozzle block with a plurality of nozzle holes, wherein the nozzle block is configured to rotatably inject air through the plurality of nozzle holes to an upper surface of the tray;

a mesh cover configured to fix the upper surface of the tray; and a vibration applier configured to apply a vibration to the tray, wherein the air injection module comprises:

a nozzle arranged over the tray to inject air to the upper surface of the tray;

an air line configured to supply the air to the nozzle;

a compressor arranged on the air line and configured to provide the air with a pressure; and a pulse generator arranged on the air line and configured to provide the air with a pulse, wherein the nozzle includes a spindle;

the nozzle block rotatably connected to the spindle with respect to a vertical direction;

a plurality of nozzle bars extending from the nozzle block in a horizontal direction; and a nozzle head extending from each of the plurality of the nozzle bars toward the tray and including the plurality of nozzle holes configured to inject the air.

14. The cleaning apparatus of claim 13, wherein the cleaning chamber comprises:

a lower chamber including a lower exhaust port connected to the vacuum generator and making contact with the lower surface of the tray; and an upper chamber combined with the lower chamber and configured to receive the air injection module and the mesh cover, the upper chamber including an upper exhaust port.

15. The cleaning apparatus of claim 13, wherein the plurality of the nozzle holes have different diameters and different injection angles.

16. The cleaning apparatus of claim 13, wherein the mesh cover comprises:

a mesh configured to cover the upper surface of the tray;

a mesh frame configured to support an edge portion of the mesh;

a lower frame configured to support a lower surface of the mesh frame; and an upper frame configured to support an upper surface of the mesh frame.

17. The cleaning apparatus of claim 13, wherein the vibration applier comprises:

a first eccentrical motor configured to apply the vibration to the tray in a first horizontal direction;

a second eccentrical motor configured to apply the vibration to the tray in a second horizontal direction perpendicular to the first horizontal direction; and a third eccentrical motor configured to apply the vibration to the tray in the vertical direction.

18. The cleaning apparatus of claim 13, wherein the cleaning chamber is configured to receive the tray that is configured to secure the plurality of semiconductor packages therein from being released by air injected on the upper surface of the tray.

* * * * *